(12) United States Patent
Baba et al.

(10) Patent No.: US 7,746,234 B2
(45) Date of Patent: Jun. 29, 2010

(54) RFID TAG

(75) Inventors: Shunji Baba, Kawasaki (JP); Shigeru Hashimoto, Tokyo (JP); Yoshiyasu Sugimura, Tokyo (JP); Tsuyoshi Niwata, Tokyo (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 365 days.

(21) Appl. No.: 11/656,520

(22) Filed: Jan. 23, 2007

(65) Prior Publication Data

US 2008/0042852 A1    Feb. 21, 2008

(30) Foreign Application Priority Data

Aug. 9, 2006    (JP) .............................. 2006-216827

(51) Int. Cl.
  *G08B 13/14*    (2006.01)
(52) U.S. Cl. .............. 340/572.8; 340/572.1; 340/572.7; 235/492
(58) Field of Classification Search ... 340/572.1–572.9, 340/825.34, 825.5; 235/492, 488, 487
  See application file for complete search history.

(56) References Cited

U.S. PATENT DOCUMENTS

| 6,031,459 | A |   | 2/2000 | Lake |   |
|---|---|---|---|---|---|
| 6,215,401 | B1 | * | 4/2001 | Brady et al. | 340/572.7 |
| 6,549,176 | B2 | * | 4/2003 | Hausladen | 343/895 |
| 6,885,354 | B2 | * | 4/2005 | Takei | 343/870 |
| 7,364,088 | B2 | * | 4/2008 | Baba | 235/492 |

FOREIGN PATENT DOCUMENTS

| EP | 1 243 442 | 9/2002 |
|---|---|---|
| EP | 1 643 420 | 4/2006 |
| EP | 1770609 A2 | 4/2007 |
| JP | 10-58873 | 3/1998 |
| JP | 11-296642 | 10/1999 |
| JP | 2000-200332 | 7/2000 |
| JP | 2000-311226 | 11/2000 |
| JP | 2001-351082 | 12/2001 |
| JP | 2003-233793 | 8/2003 |
| JP | 2005-0004430 | 1/2005 |
| WO | 2006/025017 | 3/2006 |

OTHER PUBLICATIONS

Korean Office Action issued on Dec. 17, 2008 in corresponding Korean Patent Application 10-2007-0005207.
Extended European Search Report, issued in corresponding European Patent Application No. 07100029.3 on Dec. 11, 2007.
Reasons for Rejection dated Jun. 30, 2009, issued by the Japan Patent Office in the corresponding Japanese Patent Application 2006-216827.
European Communication, issued Jan. 20, 2010 in corresponding European Patent Application No. 07100029.3-2210.

* cited by examiner

*Primary Examiner*—Anh V La
(74) *Attorney, Agent, or Firm*—Staas & Halsey LLP

(57) ABSTRACT

The RFID tag includes a base that can bend and unbend; a communication antenna wired on the base; a circuit chip that is electrically connected to the antenna and performs radio communication via the antenna; a reinforcing member as a chip reinforcing member that covers at least the periphery of the circuit chip and a section of the antenna wiring, the covering preformed at least in an upper side with respect to the base designated as a bottom, and that has a concavo-convex shape and intersects with the antenna wiring at a concave section of the concavo-convex shape; and an adhesive that adheres the reinforcing member to the base, and in which an edge along a concave section of the edge of the reinforcing member traverses over the antenna.

5 Claims, 7 Drawing Sheets

RFID TAG

CROSS REFERENCE TO RELATED APPLICATIONS

This application claims the benefit under 35 U.S.C. Section 119, of Japanese Patent Application No. 2006-216827, filed Aug. 9, 2006, which is hereby incorporated by reference in its entirety into this application.

BACKGROUND OF THE INVENTION

1. Field of the Invention

The present invention relates to an RFID (Radio Frequency Identification) tag which exchanges information with an external device in a non-contact manner. Note that among those skilled in the art in the technical field of the present application, the "RFID tag" as used in the present specification is regarded as an internal component (inlay) for the "RFID tag" and so it may be referred to as an "inlay for an RFID tag". Alternatively, this "RFID tag" may be referred to as a "wireless IC tag".

2. Description of the Related Art

Various types of RFID tags that exchange information with an external device, typically represented by a reader/writer, in a non-contact manner using radio waves have been proposed in recent years (for example, see Japanese Patent Laid-Open No. 2000-310226, Japanese Patent Laid-Open No. 2000-200332, and Japanese Patent Laid-Open No. 2001-351082). An RFID tag in which a circuit chip and a radio wave communication antenna pattern are mounted on a base sheet made of plastic or paper has been proposed as one type of such RFID tag. This type of RFID tag is designed to be used in a mode in which the RFID tag is attached to an article and identification of the article and the like can be performed by exchanging information relating to that article with an external device.

FIG. 8 is a view that illustrates an example of an RFID tag.

Part (a) of FIG. 8 is a top view of an RFID tag 800 as one example of an RFID tag, and part (b) of FIG. 8 shows a cross section along a line of cutting plane H-H of the RFID tag 800 as shown in part (a).

The RFID tag 800 shown in FIG. 8 consists of a long base 801 that is formed with PET film, a communication antenna 802 that is wired along the lengthwise direction on the base 801, a circuit chip 803 that is electrically connected to the antenna 802 and conducts radio communication via the antenna 802, and an adhesive 804 that adheres and fixes the circuit chip 803 to the base 801.

The circuit chip 803 constituting the RFID tag 800 can carry out radio communication with an external device via the antenna 802.

A wide range of usage modes including the usage mode described above can be considered for this kind of RFID tag. However, in the case of a usage mode in which the RFID tag is attached to an article that changes shape easily, such as clothing, a bending stress is applied to the circuit chip 803 because the circuit chip 803 is resistant to bending in comparison to the ease of bending of the base 801, and thus one major problem is that the circuit chip 803 breaks or the circuit chip 803 becomes unstuck from the base 801. Consequently, the following technique has already been proposed as one example of a technique for reducing the bending stress applied to the circuit chip 803.

FIG. 9 is a view showing one example of a conventional technique for reducing a bending stress that is applied to the circuit chip 803.

Part (a) of FIG. 9 is a top view of an RFID tag 900, and part (b) of FIG. 9 shows a cross section along a line of cutting plane J-J of the RFID tag 900 as shown in part (a) in a state in which the RFID tag 900 is bent.

In FIG. 9, components that are equivalent to components shown in the FIG. 8 are denoted by the same symbols as in FIG. 8, and a duplicate description of these components is omitted below.

The RFID tag 900 shown in FIG. 9 is provided with a reinforcing member 901 made of fiber-reinforced resin that covers the upper part of the circuit chip 803. The reinforcing member 901 is adhered and fixed to the base 801 with a thermosetting adhesive 902 that embeds the circuit chip 803.

As shown in part (b) of FIG. 9, according to this RFID tag 900, changes in the shape of the RFID tag 900 are prevented from reaching the vicinity of the circuit chip 803 by the reinforcing member 901 that is formed of a hard substance, namely fiber-reinforced resin, and thus the bending stress applied to the circuit chip 803 is reduced.

However, in the RFID tag 900 shown in FIG. 9 there is a problem that bending stress is concentrated at a part of the adhesive 902 that adheres and fixes the reinforcing member 901 to the base 801 where an edge section that protrudes from the reinforcing member 901 intersects with the antenna 802, resulting in a risk of the antenna 802 becoming disconnected.

SUMMARY OF THE INVENTION

The present invention has been made in view of the above circumstances and provides an RFID tag in which a bending stress applied to a circuit chip is reduced while also avoiding disconnection of an antenna.

An RFID tag according to the present invention includes:

a base that can bend and unbend;

a communication antenna that is wired on the base;

a circuit chip that is electrically connected to the antenna and performs radio communication via the antenna; and a chip reinforcing member that covers at least a periphery of the circuit chip and a part of a wiring of the antenna, the covering being performed at least in an upper side with respect to the base designated as a bottom, and has a first edge section against which the base contacts internally and then bends, and a second edge section that is located inward further than the first edge section with respect to the bending of the base and which intersects with a wiring of the antenna.

According to the RFID tag of this invention, changes in shape of the base are prevented from reaching the circuit chip by the chip reinforcing member to thereby reduce a bending stress applied to the circuit chip. Further, according to the RFID tag of this invention, when the base bends, with respect to a section in the periphery of the antenna on the base, since that section bends gradually without contacting against the first edge section when the base bends, the radius of bending is larger than that of a section that contacts the first edge section, and thus the bending stress with respect to the antenna is dispersed. As a result, the bending stress applied to the antenna is reduced and a disconnection can be avoided. More specifically, according to the RFID tag of this invention, a bending stress applied to the circuit chip is reduced and disconnection of the antenna is also avoided.

In this case, a preferred form of the RFID tag of this invention is one in which "the chip reinforcing member has an edge that is formed in a concavo-convex shape, and a convex section of that concavo-convex shape is the first edge section and a concave section of that concavo-convex shape is the second edge section," or a form in which "the base is long in a predetermined direction, the antenna extends along the predetermined direction, and the chip reinforcing member is provided such that the second edge section traverses over the antenna wiring in a diagonal manner with respect to the predetermined direction" is also a preferable form.

According to these forms, a condition in which a section in the periphery of the antenna on the base bends with a larger bending radius than other sections can be easily realized. Further, according to the latter form, since the second edge section diagonally traverses the antenna wiring, the thickness of a section of the antenna that intersects with the second edge section becomes substantially thicker. Thus, the antenna itself becomes stronger with respect to bending stress at a section that intersects with the second edge section.

Further, a form in which "the antenna has two kinds of antenna sections that have wiring of respectively different widths, and the first edge section of the chip reinforcing member intersects with wiring of an antenna section having a wiring width that is relatively wide between the two kinds of antenna sections, and the second edge section of the chip reinforcing member intersects with wiring of an antenna section having a wiring width that is relatively narrow between the two kinds of antenna sections" is also a preferable form.

According to this preferred form of the RFID tag, for an antenna section intersecting with the first edge section for which there is a fear of bending stress concentrating at that section, since the thickness is relatively thick, the resistance to bending stress is reinforced. Thus, even when an antenna has multiple antenna sections and several sections among those antenna sections must, for example, intersect with the first edge section due to wiring constraints or the like, disconnections can be avoided with respect to all the antenna sections.

Further, a form of the RFID tag of this invention in which "the chip reinforcing member covers one part of the antenna wiring and only the periphery of the circuit chip" is also a preferred form.

According to an RFID tag of this preferred form, while the circuit chip is protected by the chip reinforcing member covering the periphery of the circuit chip, the upper part of the circuit chip is in an open state, and thus a thinner version of the RFID tag can be made.

Further, a form of the RFID tag of this invention in which "an underside reinforcing member is provided that is disposed sandwiching the base with respect to the reinforcing member" is also a preferable form.

According to an RFID tag of this preferred form, the protective properties with respect to the circuit chip are further enhanced by the underside reinforcing member.

As described above, according to the present invention an RFID tag can be obtained in which a bending stress applied to a circuit chip is reduced and disconnection of an antenna is also avoided.

DETAILED DESCRIPTION OF THE INVENTION

Embodiments of the present invention will be described below with reference to the drawings.

First, a first embodiment of the RFID tag according to the present invention is described.

Figure 1:
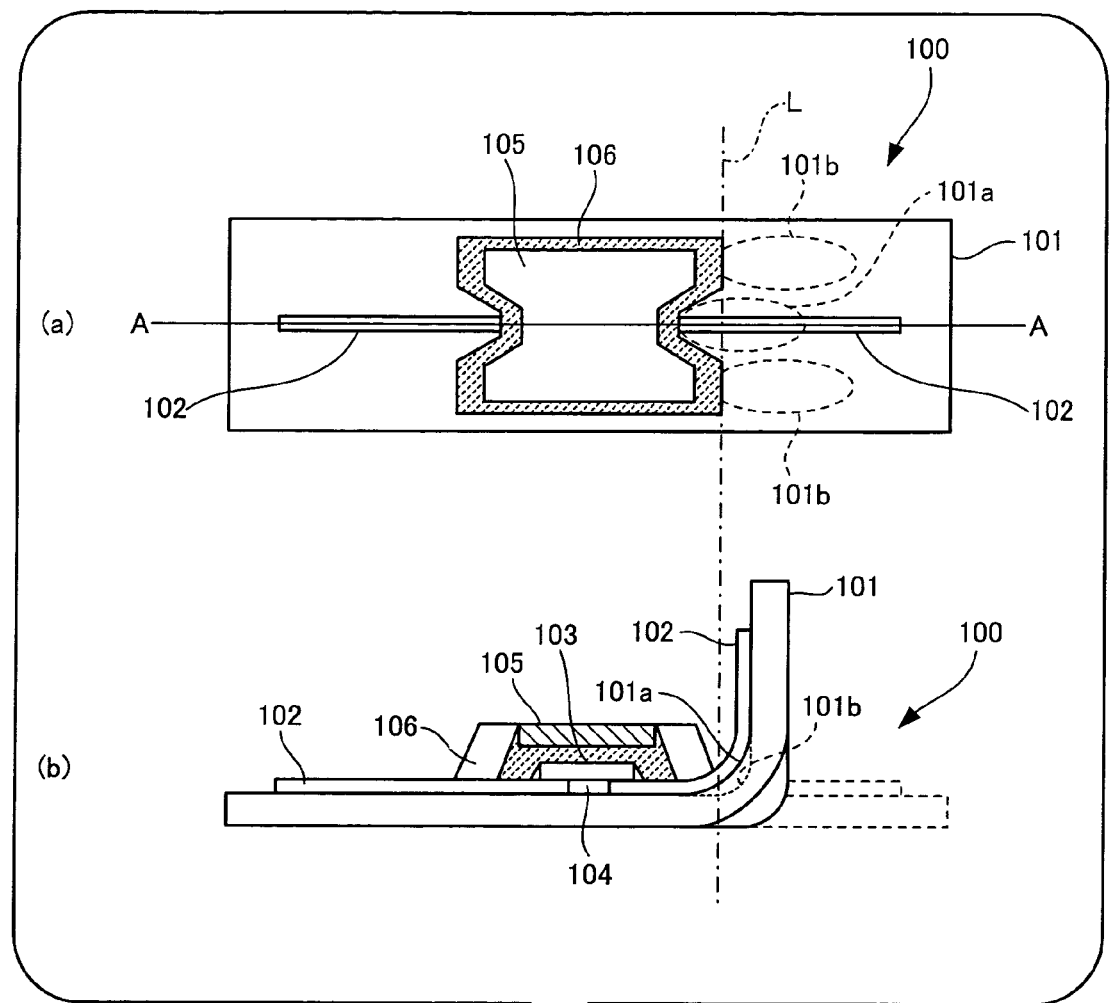
FIG. 1 is a view that illustrates a first embodiment of an RFID tag according to the present invention.

FIG. 1 is a view illustrating the first embodiment of the RFID tag according to the present invention.

Part (a) of FIG. 1 is a top view of an RFID tag 100 as a first embodiment of the RFID tag according to this invention, and part (b) of FIG. 1 shows a cross section along a line of cutting plane A-A of the RFID tag 100 as shown in part (a) in a state in which the RFID tag 100 is bent.

The RFID tag 100 shown in FIG. 1 consists of a long base 101 that is formed with PET film, a communication antenna 102 that is wired along the lengthwise direction on the base 101, a circuit chip 103 that is electrically connected to the antenna 102 and carries out radio communication via the antenna 102, an adhesive 104 that adheres and fixes the circuit chip 103 to the base 101, a reinforcing member 105 made of fiber-reinforced resin that covers the upper part of the circuit chip 103, and a thermosetting adhesive 106 that adheres and fixes the reinforcing member 105 to the base 101. In this case, the adhesive 106 is provided in a heaped state on the base 101 so as to embed the circuit chip 103, and has a hardness of the same level as the reinforcing member 105 after hardening. The base 101, antenna 102 and circuit chip 103 correspond to an example of the base, the antenna and the circuit chip according to the present invention, respectively. Further, a member obtained by combining the reinforcing member 105 and the adhesive 106 that adheres and fixes the reinforcing member 105 to the base 101 corresponds to an example of the chip reinforcing member according to the present invention.

According to the RFID tag 100, changes in the shape of the RFID tag 100 are prevented from reaching the circuit chip 103 by the reinforcing member 105 that is formed of a hard substance, namely fiber-reinforced resin, and thus the bending stress applied to the circuit chip 103 is reduced.

Further, the reinforcing member 105 of the RFID tag 100 is a plate that has edges formed in a concavo-convex shape, and the edges of concave sections of the concavo-convex shape are disposed so as to intersect with the antenna 102. As a result, the edge of the adhesive 106 that adheres and fixes the reinforcing member 105 to the base has a concavo-convex shape along the edge of the reinforcing member 105, and a concave section (corresponds to an example of a second edge section according to this invention) of the edge of the adhesive 106 traverses the antenna 102.

In this case, since the base 101 of the RFID tag 100 is made of PET film and has the flexibility to bend and unbend, the RFID tag 100 can bend according to changes in the shape of an article to which the RFID tag 100 is attached. Further, in most cases the RFID tag 100 bends along a bend line L that contacts internally with a convex section (corresponds to an example of a first edge section according to this invention) of the edge of the adhesive 106 that adheres and fixes the reinforcing member 105 to the base. At this time, a base section 101a in the vicinity of the antenna 102 bends gradually without contacting against the edge of the adhesive 106. Consequently, the bending radius of the base section 101a in the vicinity of the antenna 102 is greater than the bending radius of other bending base sections 101b that contact internally against the convex section of the edge of the adhesive 106, and thus the bending stress with respect to the antenna 102 is dispersed. As a result, a bending stress applied to the antenna 102 is reduced and disconnection is avoided. More specifically, according to the RFID tag 100 of this embodiment, a bending stress applied to the circuit chip 103 is reduced and disconnection of the antenna 102 is also avoided.

Next, a second embodiment of the RFID tag according to the present invention is described.

Figure 2:
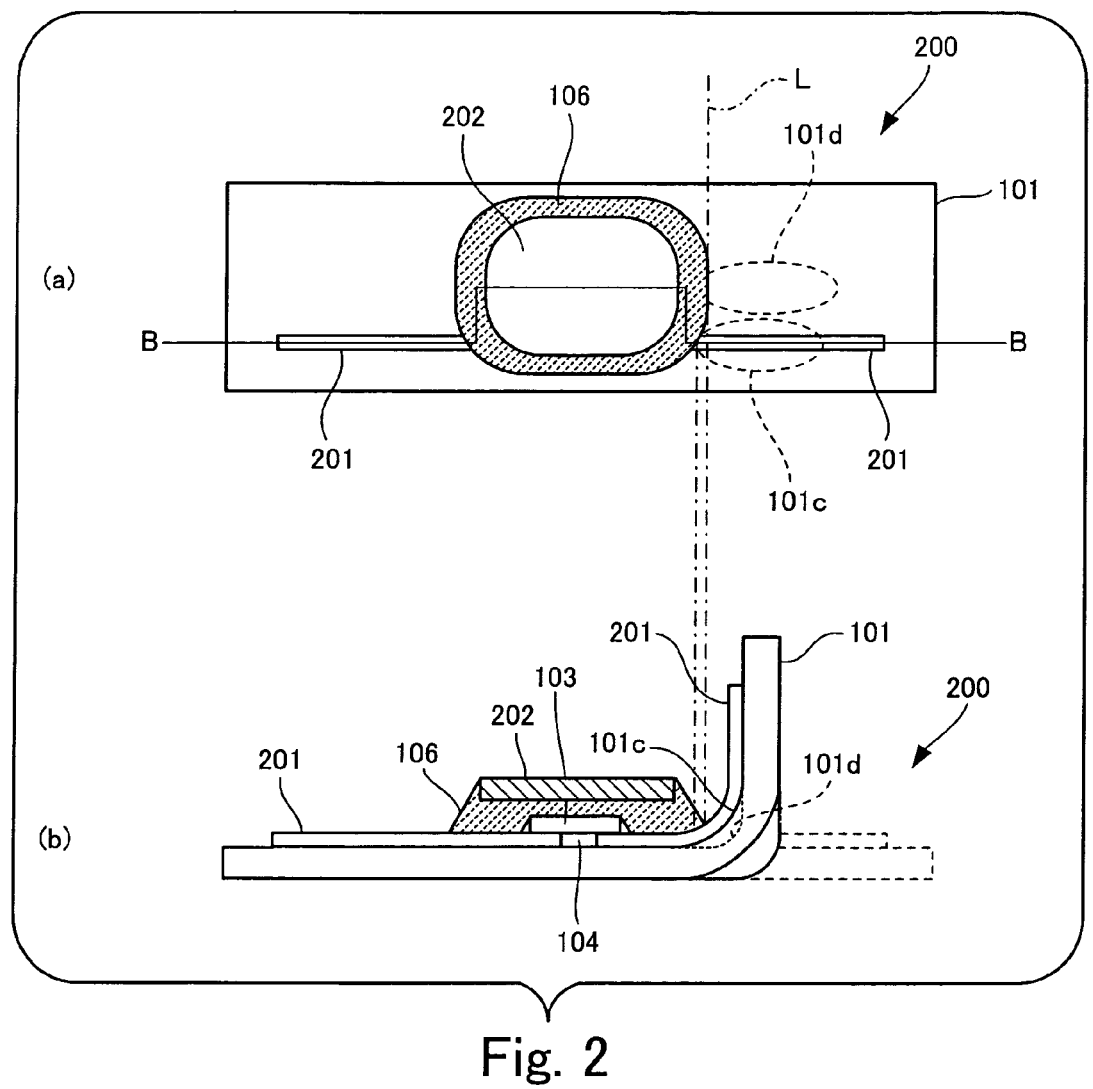
FIG. 2 is a view that illustrates a second embodiment of an RFID tag according to the present invention.

FIG. 2 is a view illustrating the second embodiment of the RFID tag according to the present invention.

Part (a) of FIG. 2 is a top view of an RFID tag 200 as a second embodiment of the RFID tag according to this invention, and part (b) of FIG. 2 shows a cross section along a line of cutting plane B-B of the RFID tag 200 as shown in part (a) in a state in which the RFID tag 200 is bent.

In FIG. 2, components that are equivalent to components of the first embodiment as shown in FIG. 1 are denoted by the same symbols as in FIG. 1, and a duplicate description of these components is omitted below.

In the RFID tag 200 according to this embodiment, the shape of a reinforcing member 202 is different to that of the first embodiment. Further, in the RFID tag 200 according to the present embodiment the position of an antenna 201 on the base 101 differs to that of the first embodiment in accordance with the shape of the reinforcing member 202. A member obtained by combining the reinforcing member 202 as shown in FIG. 2 and the adhesive 106 that adheres and fixes the reinforcing member 202 to the base 101 corresponds to an example of a chip reinforcing member according to the present invention.

Similarly to the first embodiment, the reinforcing member 202 of the RFID tag 200 is also a plate formed of fiber-reinforced resin, and it prevents changes in the shape of the RFID tag 200 reaching the circuit chip 103, and thus the bending stress applied to the circuit chip 103 is reduced.

In this case, as shown in part (a) of FIG. 2, the shape of the top surface of the reinforcing member 202 according to the present embodiment is one in which the four corners are rounded, and sections of these round corners at the edge of the reinforcing member 202 are disposed so as to diagonally traverse over the wiring of the antenna 201. As a result, among the edges of the adhesive 106 that adheres and fixes the reinforcing member 202 to the base, round corner sections (corresponding to an example of a second edge section according to this invention) along the edge of the reinforcing member 202 diagonally traverse over the antenna 201.

In most cases, the RFID tag 200 shown in FIG. 2 bends along a bend line L that contacts internally with a section (corresponding to an example of a first edge section according to this invention) of the edge of the adhesive 106 that projects most in the longitudinal direction of the RFID tag 200. At this time, according to the present embodiment, a base section 101c in the vicinity of the antenna 201 bends gradually without contacting against the edge of the adhesive 106. Consequently, the bending radius of the base section 101c in the vicinity of the antenna 201 is greater than the bending radius of another bending base section 101d that contacts internally against a section that projects most in the longitudinal direction, and thus the bending stress with respect to the antenna 201 is dispersed. As a result, the bending stress applied to the antenna 201 is reduced and disconnection is avoided. Further, according to the present embodiment, since an edge of the adhesive 106 diagonally traverses over the antenna 201, the thickness of a section of the antenna 201 that intersects with that edge becomes substantially thicker. Therefore, the antenna 201 itself becomes stronger with respect to bending stress at the section that intersects with that edge. Thus, in the RFID tag 200 according to the present embodiment, similarly to the first embodiment, a bending stress applied to the circuit chip is reduced and disconnection of the antenna is also avoided.

Next, a third embodiment of the RFID tag according to the present invention is described.

Figure 3:
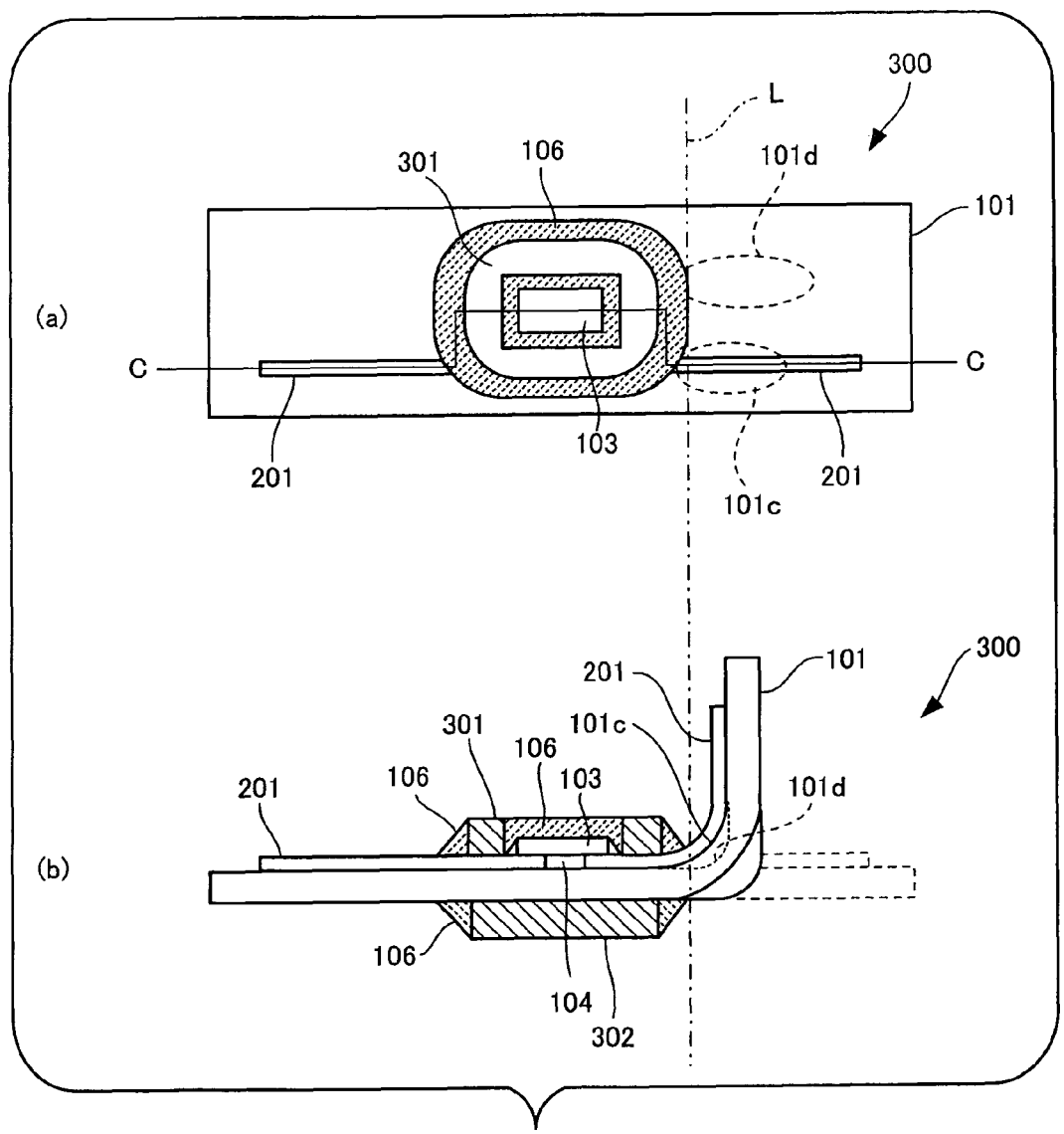
FIG. 3 is a view that illustrates a third embodiment of an RFID tag according to the present invention.

FIG. 3 is a view illustrating the third embodiment of the RFID tag according to the present invention.

Part (a) of FIG. 3 is a top view of an RFID tag 300 as a third embodiment of the RFID tag according to this invention, and part (b) of FIG. 3 shows a cross section along a line of cutting plane C-C of the RFID tag 300 as shown in part (a) in a state in which the RFID tag 300 is bent.

In FIG. 3, components that are equivalent to components of the second embodiment as shown in FIG. 2 are denoted by the same symbols as in FIG. 2, and a duplicate description of these components is omitted below.

In the RFID tag 300 according to this embodiment, the shape of a reinforcing member 301 is different to the shape of the reinforcing member 202 shown in the second embodiment. Further, the RFID tag 300 according to this embodiment differs from the second embodiment in the respect that a reinforcing member (underside reinforcing member 302) that reduces the bending stress applied to the circuit chip 103 is provided on an undersurface side of the base 101 that is opposite to the side of the circuit chip 103. A member obtained by combining the reinforcing member 301 shown in FIG. 3 and the adhesive 106 that adheres and fixes the reinforcing member 301 to the base 101 corresponds to an example of a chip reinforcing member according to the present invention.

The reinforcing member 301 of the RFID tag 300 has a shape in which, as shown in FIG. 3, an opening that houses the circuit chip 103 is provided in the reinforcing member 202 according to the second embodiment as shown in FIG. 2. The reinforcing member 301 is fixed to the base 101 by the thermosetting adhesive 106 in a manner whereby it houses the circuit chip 103 within the opening. Further, the inside of the opening in which the circuit chip 103 is housed is filled with the adhesive 106. According to the present embodiment, by housing the circuit chip 103 within an opening in the reinforcing member 301, the upper part of the circuit chip 103 remains in an open state, and it is thus possible to decrease the thickness of the RFID tag 300 by this open amount. Further, according to the present embodiment, the underside reinforcing member 302 that has the same shape as the reinforcing member 301, excluding the existence of an opening, is fixed by the thermosetting adhesive 106 at a position on the underside of the base 101 that is opposite to position on the surface side at which the circuit chip 103 is disposed, such that the base 101 is sandwiched between the underside reinforcing member 302 and the reinforcing member 301. This underside reinforcing member 302 is also formed of fiber-reinforced resin, similarly to the reinforcing member 301, and thus according to the present embodiment the reduction of the bending stress applied to the circuit chip 103 is reinforced.

In the reinforcing member 301 according to the present embodiment, similarly to the second embodiment, the bending radius of a base section 101c in the vicinity of the antenna 201 is greater than the bending radius of another bending base section 101d that contacts internally against a section that projects most in the longitudinal direction, and thus the bending stress with respect to the antenna 201 is dispersed. Further, since an edge of the adhesive 106 diagonally traverses over the antenna 201, the thickness of a section of the antenna 201 that intersects with that edge becomes substantially thicker. Therefore, the antenna 201 itself becomes stronger with respect to bending stress at the section that intersects with that edge. Thus, in the RFID tag 300 according to the present embodiment, similarly to the first and second embodiments, a bending stress applied to the circuit chip is reduced and disconnection of the antenna is also avoided.

Next, the four embodiments from the fourth to seventh embodiment of the RFID tag according to this invention will be described in order. Regarding the cross sections, since the cross sections of the following embodiments are substantially the same as those referred to in the descriptions of the first to third embodiments, a diagrammatic representation of the cross sections is omitted hereunder, and a description is made by referring only to top views.

First, the fourth embodiment of the RFID tag according to the present invention is described.

Figure 4:
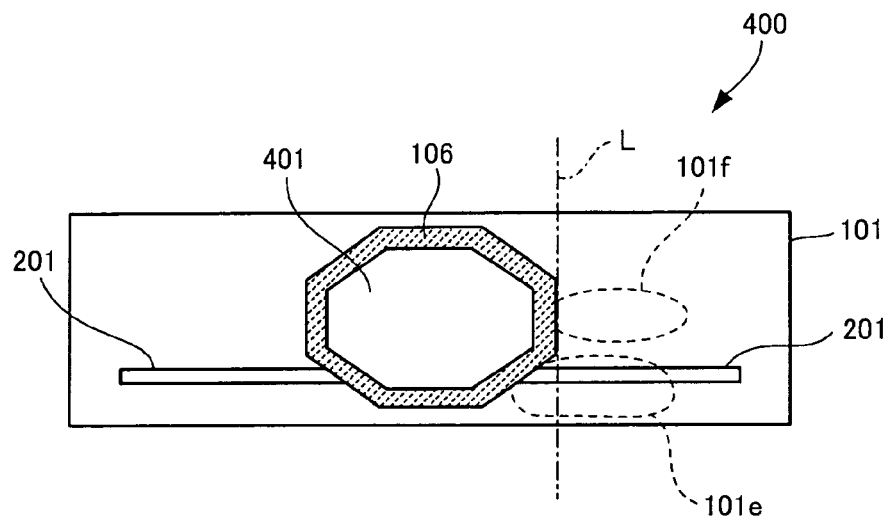
FIG. 4 is a top view that illustrates a fourth embodiment of an RFID tag according to the present invention.

FIG. 4 is a top view that illustrates the fourth embodiment of the RFID tag according to the present invention.

In FIG. 4, components that are equivalent to components of the second embodiment as shown in FIG. 2 are denoted by the same symbols as in FIG. 2, and a duplicate description of these components is omitted below.

In an RFID tag 400 shown in FIG. 4, the shape of a reinforcing member 401 that fulfills a function of reducing a bending stress applied to a circuit chip is different to the shape of the reinforcing member 202 in the second embodiment. A member obtained by combining the reinforcing member 401 of the RFID tag 400 and the adhesive 106 that adheres and fixes the reinforcing member 401 to the base 101 corresponds to an example of a chip reinforcing member according to the present invention.

The reinforcing member 401 according to the present embodiment has a shape in which the corners of the upper surface thereof are linearly chamfered, and those chamfered sections at the edge of the reinforcing member 401 are disposed so as to diagonally traverse over the wiring of the antenna 201. As a result, a section (corresponding to an example of a second edge section according to this invention) of the edge of the thermosetting adhesive 106 that is parallel to the chamfered section at the edge of the reinforcing member 401 also diagonally traverses over the wiring of the antenna 201. Thus, when the RFID tag 400 bends along a bend line L that contacts internally with a section (corresponding to an example of a first edge section according to this invention) that projects most in the longitudinal direction among the edges of the adhesive 106, the bending radius of a base section 101e in the vicinity of the antenna 201 that does not contact against the edge of the adhesive 106 is greater than another bending section 101f that contacts internally against a section of the adhesive 106 that projects most in the longitudinal direction, and it therefore bends in a state in which the bending stress is dispersed. Further, since the edge of the adhesive 106 diagonally traverses over the antenna 201, the antenna 201 itself becomes stronger with respect to bending stress at the section that intersects with that edge. Thus, in the RFID tag 400 according to the present embodiment, similarly to the first to third embodiments, a bending stress applied to the circuit chip is reduced and disconnection of the antenna is also avoided.

Next, the fifth embodiment of the RFID tag according to the present invention is described.

Figure 5:
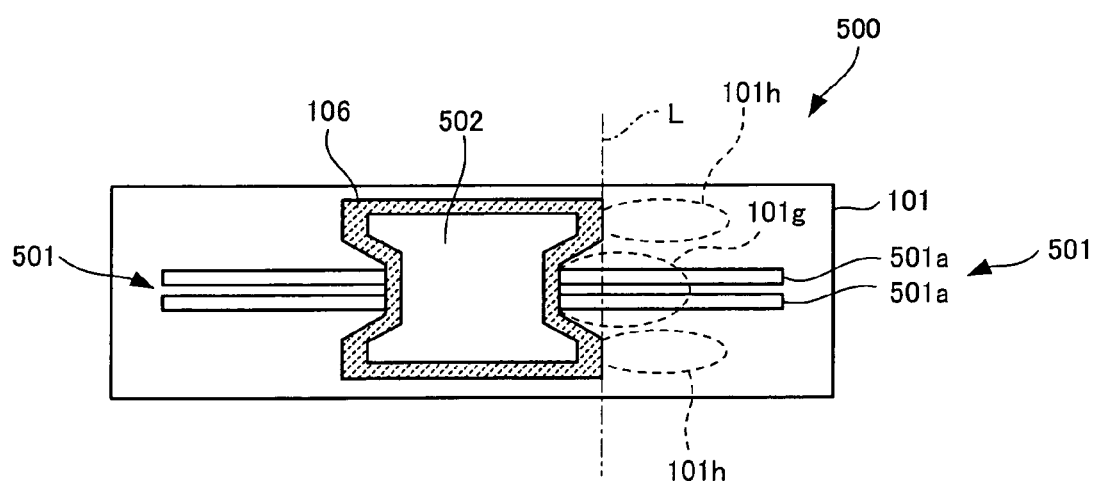
FIG. 5 is a top view that illustrates a fifth embodiment of an RFID tag according to the present invention.

FIG. 5 is a top view that illustrates the fifth embodiment of the RFID tag according to the present invention.

In FIG. 5, components that are equivalent to components of the first embodiment shown in FIG. 1 are denoted by the same symbols as in FIG. 1, and a duplicate description of these components is omitted below.

An RFID tag 500 shown in FIG. 5 differs to the RFID tag 100 of the first embodiment as shown in FIG. 1 in the respects that an antenna 501 that has antenna sections 501a that are parallel to each other is wired on the base 101, and the widths of concave sections of concavo-convex shaped edges of a reinforcing member 502 that fulfills a function of reducing the bending stress applied to a circuit chip are somewhat wider. A member obtained by combining the reinforcing member 502 shown in FIG. 5 and the adhesive 106 that adheres and fixes the reinforcing member 502 to the base 101 corresponds to an example of a chip reinforcing member according to this invention. Further, the antenna 501 shown in FIG. 5 corresponds to an example of an antenna according to this invention.

In the RFID tag 500, the reinforcing member 502 is disposed such that, among the edges of the reinforcing member 502, the edges of the concave sections intersect with the two antenna sections 501a. As a result, among the edges of the adhesive 106 that adheres and fixes the reinforcing member 502 to the base 101, a concave section (correspond to an example of a second edge section according to this invention) along the edge of the reinforcing member 502 traverses over the two antenna sections 501a. Thus, when the RFID tag 500 bends along the bend line L that is the same as in the first embodiment, a base section 101g in the vicinity of the two antenna sections 501a has a larger bending radius than other bending base sections 101h that contact internally with convex sections (corresponding to an example of a first edge section according to this invention) of the edge of the adhesive 106, and it therefore bends in a state in which the bending stress is dispersed such that the bending stress applied to the antenna 501 is reduced and disconnection is avoided. More specifically, in the RFID tag 500 according to the present embodiment also, similarly to the first to fourth embodiments, a bending stress applied to the circuit chip is reduced and disconnection of the antenna is also avoided.

Next, the sixth embodiment of the RFID tag according to the present invention is described.

Figure 6:
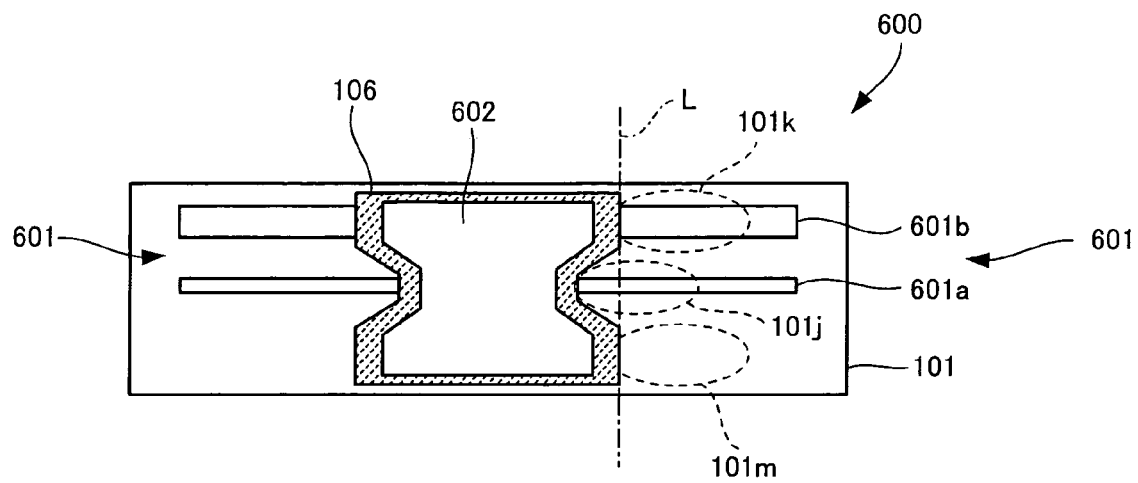
FIG. 6 is a top view that illustrates a sixth embodiment of an RFID tag according to the present invention.

FIG. 6 is a top view that illustrates the sixth embodiment of an RFID tag according to the present invention.

In FIG. 6, components that are equivalent to components of the first embodiment shown in FIG. 1 are denoted by the same symbols as in FIG. 1, and a duplicate description of these components is omitted below.

An RFID tag 600 shown in FIG. 6 differs to the RFID tag 100 of the first embodiment shown in FIG. 1 in the respects that an antenna 601 that has two kinds of antenna sections 601a and 601b that have different thicknesses to each other is wired on the base 101, and the widths of concave sections of concavo-convex shaped edges of a reinforcing member 602 that fulfills a function of reducing a bending stress applied to a circuit chip are somewhat wider. A member obtained by combining the reinforcing member 602 shown in FIG. 6 and the adhesive 106 that adheres and fixes the reinforcing member 602 to the base 101 corresponds to an example of a chip reinforcing member according to this invention. Further, the antenna 601 shown in FIG. 6 corresponds to an example of an antenna according to this invention.

According to the present embodiment, the reinforcing member 602 is disposed such that, among the edges of the reinforcing member 602, edges of concave sections intersect with the relatively thin antenna section 601a and edges of convex sections intersect with the relatively thick antenna section 601b. As a result, among the edges of the adhesive 106 that adheres and fixes the reinforcing member 602 to the base 101, a concave section (corresponds to an example of a second edge section according to this invention) of the edge of the adhesive 106 along an edge of the reinforcing member 602 traverses over the relatively thin antenna section 601a, and a convex section (corresponds to an example of a first edge section according to this invention) of the edge of the adhesive 106 traverses over the relatively thick antenna section 601b.

When the RFID tag 600 bends along the bend line L that is the same as in the first embodiment, a base section 101j in the vicinity of the relatively thin antenna section 601a internally contacts with a convex section of the edge of the adhesive 106 and bends. At this time, the base section 101j bends in a state in which it has a bending radius that is relatively larger than that of a base section 101k in the vicinity of the relatively thick antenna section 601b and another base section 101m and the bending stress is thus dispersed, thereby reducing the bending stress and avoiding disconnection. In this case, regarding the base section 101k in the vicinity of the relatively thick antenna section 601b, although the bending radius thereof is relatively small and there is a concern that the bending stress is concentrated at the antenna section 601b, since according to the present embodiment the antenna section 601b is thick and resistance thereof to bending stress is thus reinforced, a disconnection can also be avoided at the antenna section 601b. More specifically, in the RFID tag 600 according to the present embodiment, similarly to the first to fifth embodiments, a bending stress applied to the circuit chip is reduced and disconnection of the antenna is also avoided.

Next, the seventh embodiment of the RFID tag according to the present invention is described.

Figure 7:
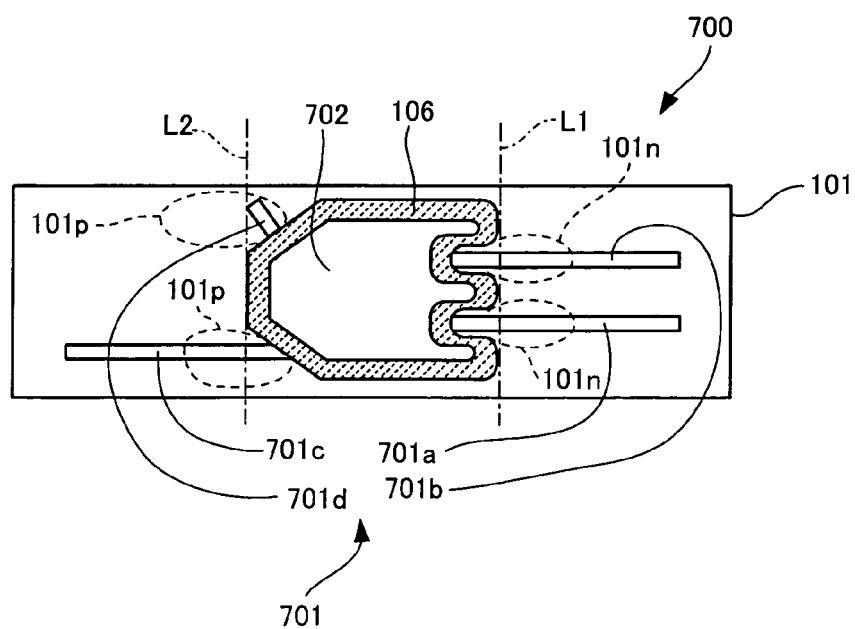
FIG. 7 is a top view that illustrates a seventh embodiment of an RFID tag according to the present invention.
Figure 8:
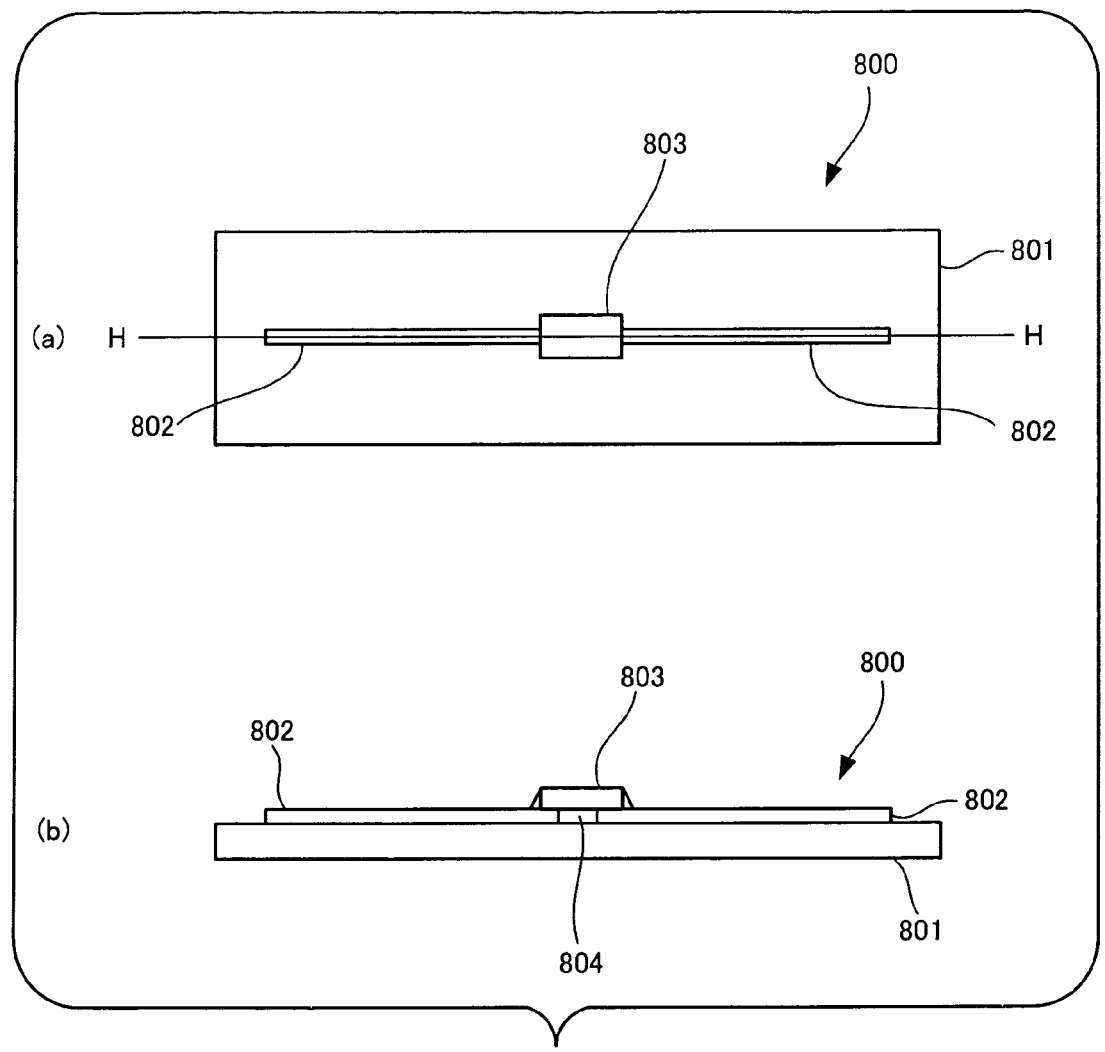
FIG. 8 is a view that illustrates an example of an RFID tag.
Figure 9:
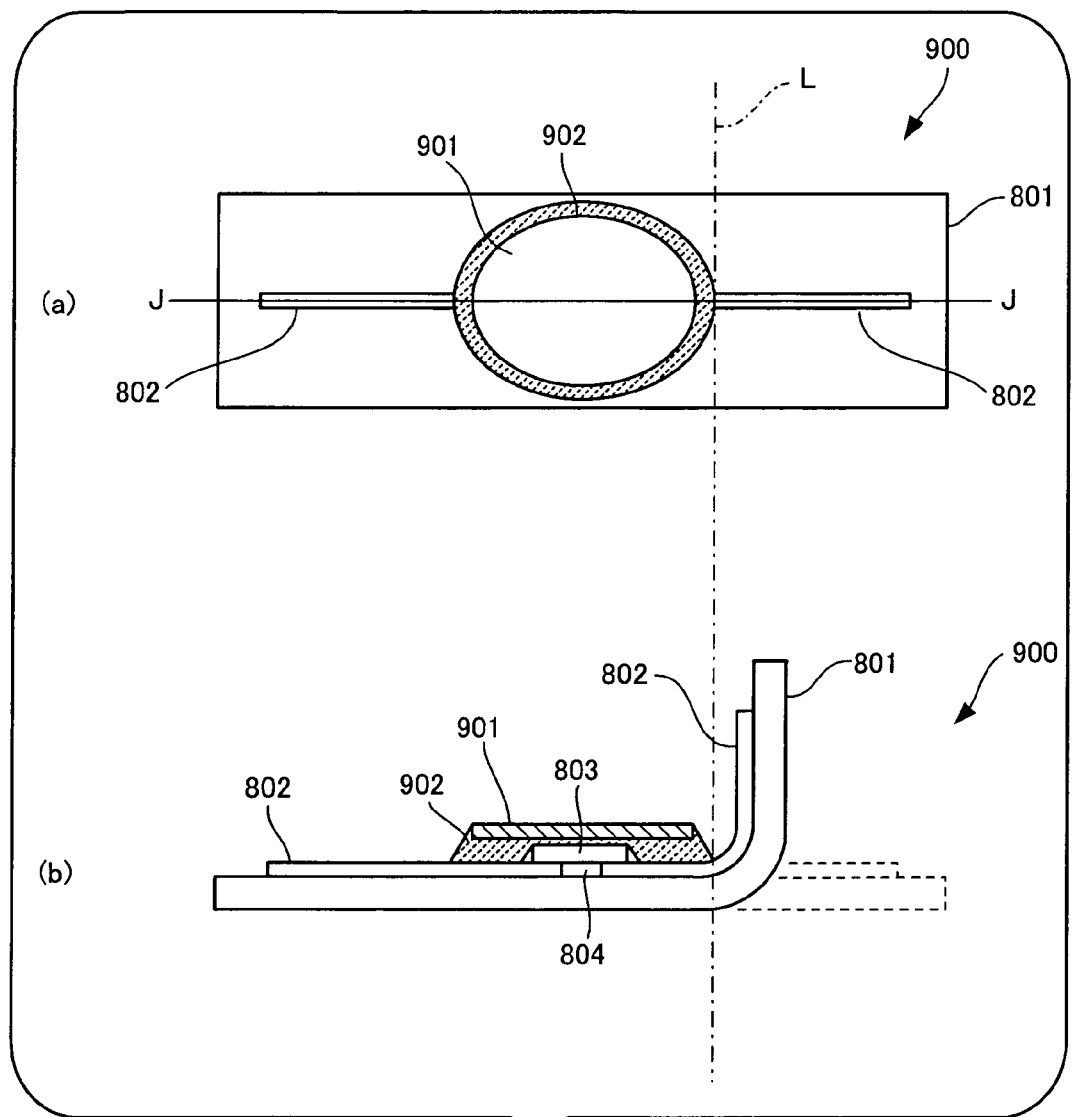
FIG. 9 is a view that illustrates an example of a conventional technique for reducing bending stress applied to a circuit chip 803.

FIG. 7 is a top view that illustrates the seventh embodiment of an RFID tag according to the present invention.

In FIG. 7, components that are equivalent to components of the first embodiment shown in FIG. 1 are denoted by the same symbols as in FIG. 1, and a duplicate description of these components is omitted below.

In an RFID tag 700 shown in FIG. 7, the shape of a reinforcing member 702 that fulfills a function of reducing a bending stress applied to a circuit chip is different to the shape of the reinforcing member 105 in the first embodiment as shown in FIG. 1. Further, the feature that an antenna 701 that includes four antenna sections 701a, 701b, 701c and 701d is wired on the base 101 is also different to the RFID tag 100 according to the first embodiment that is shown in FIG. 1. A member obtained by combining the reinforcing member 702 of the RFID tag 700 and the adhesive 106 that adheres and fixes the reinforcing member 702 to the base 101 corresponds to an example of a chip reinforcing member according to this invention. Further, the antenna 701 shown in FIG. 7 corresponds to an example of an antenna according to this invention.

The reinforcing member 702 of the RFID tag 700 shown in FIG. 7 has, with respect to its top surface shape, a curved concavo-convex shaped edge that includes concave sections at two locations on the right side of the figure, and has linearly chamfered sections at two locations on the left side thereof. The reinforcing member 702 is disposed such that the edges of the concave sections at two locations intersect respectively with two antenna sections 701a and 701b that extend to the right side in the figure, a chamfered section on the lower side intersects with the antenna section 701c that extends to the left side, and a chamfered section on the upper side intersects with the antenna section 701d that extends upward in a slanting direction to the left. As a result, among the edges of the adhesive 106 that adheres and fixes the reinforcing member 702 to the base 101, the concave sections (corresponding to an example of a second edge section according to this invention) at two locations on the edge of the adhesive 106 that runs along the edge of the reinforcing member 702 traverse respectively over the two antenna sections 701a and 701b that extend to the right side in the figure, an edge (corresponding to an example of a second edge section according to this invention) that runs along the chamfered section on the lower side traverses diagonally over the antenna section 701c that extends to the left side, and an edge (corresponding to an example of a second edge section according to this invention) that runs along the chamfered section on the upper side traverses over the antenna section 701d that extends upward in a slanting direction to the left.

When the RFID tag 700 bends along a bend line L1 that runs along sections of the edge of the adhesive 106 on the right side in the figure that projects most in the longitudinal direction, base sections 101n in the vicinity of the two antenna sections 701a and 701b, respectively, that are traversed by the concave sections bend in a state in which the bending stress is dispersed. Further, when the RFID tag 700 bends along a bend line L2 that runs along a section of the edge of the adhesive 106 on the left side in the figure that projects most in the longitudinal direction, base sections 101p in the vicinity of the two antenna sections 701c and 701d, respectively, that are traversed by the edges that run along the chamfered sections also bend in a state in which the bending stress is dispersed. Further, the antenna section 701c and 701d that are diagonally traversed by edges that run along the chamfered sections have strong resistance to bending stress. Thus, disconnection of the antenna 701 having the four antenna sections 701a . . . 701d is avoided. More specifically, in the RFID tag 700 according to the present embodiment, similarly to the first to sixth embodiments, the bending stress applied to the circuit chip is reduced and disconnection of the antenna is also avoided.

Although in the above description an opening that houses a circuit chip was illustrated employing only an example of a reinforcing member of a type that in which four corners are rounded (reinforcing member 301 shown in FIG. 3), the present invention is not limited thereto, and this kind of opening may be provided in a reinforcing member of a type having a concavo-convex shaped edge as shown in FIG. 1, FIG. 5 and FIG. 6, or may be provided in a reinforcing member of a type in which four corners were chamfered as shown in FIG. 4, or may be provided in a reinforcing member of a type having a concavo-convex shaped edge and chamfered sections as shown in FIG. 7 or the like.

Further, although in the above description an underside reinforcing member that reinforces a reduction in bending stress that is applied to a circuit chip is exemplified only with respect to the reinforcing member 301 that is of a type provided with an opening that houses a circuit chip, as shown in FIG. 3, this invention is not limited thereto. This kind of underside reinforcing member may also be used together with a reinforcing member of a type having a concavo-convex shaped edge as shown in FIG. 1, FIG. 5 and FIG. 6, or may be used together with a reinforcing member of a type in which four corners were chamfered as shown in FIG. 4, or may be used together with a reinforcing member of a type having a concavo-convex shaped edge and chamfered sections as shown in FIG. 7 or the like.

What is claimed is:

1. An RFID tag, comprising:
   a base that can bend and unbend;
   a first antenna provided on the base;
   a circuit chip that is electrically connected to the first antenna and configured to perform radio communication via the first antenna; and
   a chip reinforcing member that covers at least a periphery of the circuit chip and a part of the first antenna, and having an edge including a concave section located between two convex sections in a plane parallel to the base,
   wherein the concave section is disposed so as to intersect with the first antenna, and wherein, in use, the RFID tag is bendable along a bend line that meets the convex sections, such that a bending radius of a section of the base in the vicinity of the first antenna is greater than a bending radius of other sections of the base that meet the convex sections.

2. The RFID tag according to claim 1, wherein:
   the base having a first direction longer than a second direction, and the first antenna extends along the first direction, and the concave section of the chip reinforcing member traverses the first antenna diagonally with respect to the first direction.

3. The RFID tag according to claim 1, further comprising a second antenna that is provided on the base, the second antenna having a larger width than that of the first antenna and is connected to the circuit chip and disposed so as to intersect with one of the convex sections.

4. The RFID tag according to claim 1, wherein the chip reinforcing member covers a part of the first antenna and only a periphery of the circuit chip.

5. The RFID tag according to claim 1, further comprising an underside reinforcing member disposed at a position sandwiching the base with respect to the chip reinforcing member.

* * * * *